(12) United States Patent
Goodner

(10) Patent No.: US 7,563,727 B2
(45) Date of Patent: Jul. 21, 2009

(54) LOW-K DIELECTRIC LAYER FORMED FROM ALUMINOSILICATE PRECURSORS

(75) Inventor: Michael D. Goodner, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/984,595

(22) Filed: Nov. 8, 2004

(65) Prior Publication Data

US 2006/0097359 A1    May 11, 2006

(51) Int. Cl.
   *H01L 21/31* (2006.01)
(52) U.S. Cl. .............................. 438/778; 257/E21.273; 427/255.393
(58) Field of Classification Search ............ 427/255.32, 427/255.393, 255.17–19, 255.28, 255.34, 427/255.37; 438/778, 786–790; 257/E21.273; 117/88, 104
See application file for complete search history.

(56) References Cited

U.S. PATENT DOCUMENTS

| | | | | |
|---|---|---|---|---|
| 3,061,587 A | * | 10/1962 | Rust et al. ...................... | 528/25 |
| 6,699,797 B1 | | 3/2004 | Morris et al. | |
| 6,737,365 B1 | | 5/2004 | Kloster et al. | |
| 7,033,560 B2 | * | 4/2006 | Clark et al. .................. | 423/326 |
| 2003/0127640 A1 | | 7/2003 | Eguchi et al. | |
| 2004/0044163 A1 | | 3/2004 | Clark et al. | |
| 2004/0099951 A1 | | 5/2004 | Park et al. | |
| 2004/0130031 A1 | | 7/2004 | Chen et al. | |
| 2004/0170760 A1 | | 9/2004 | Meagley et al. | |
| 2004/0176488 A1 | * | 9/2004 | Mukherjee et al. ............ | 521/61 |
| 2004/0185679 A1 | | 9/2004 | Ott et al. | |
| 2004/0195693 A1 | | 10/2004 | Kloster et al. | |
| 2006/0063394 A1 | | 3/2006 | McSwiney et al. | |

FOREIGN PATENT DOCUMENTS

| | | |
|---|---|---|
| EP | 1785459 A1 | 5/2007 |
| JP | 56130945 | 10/1981 |
| WO | WO 01/86708 A2 | 11/2001 |
| WO | WO 2004/017378 A2 | 2/2004 |
| WO | 2006053069 A3 | 5/2006 |

OTHER PUBLICATIONS

International Application No. PCT/US2005/040635, International Search Report.

* cited by examiner

*Primary Examiner*—Matthew C Landau
*Assistant Examiner*—Candice Y Chan
(74) *Attorney, Agent, or Firm*—George Chen

(57) ABSTRACT

A method for forming a high mechanical strength, low k, interlayer dielectric material with aluminosilicate precursors so that aluminum is facilely incorporated into the silicon matrix of the material, and an integrated circuit device comprising one or more high-strength, low-k interlayer dielectric layers so formed.

13 Claims, 7 Drawing Sheets

LOW-K DIELECTRIC LAYER FORMED FROM ALUMINOSILICATE PRECURSORS

FIELD OF THE INVENTION

The present invention relates generally to the field of semiconductor integrated circuit (IC) manufacturing. In particular, the present invention relates to a method for forming a low-k dielectric material in an integrated circuit device, and the material so formed.

BACKGROUND OF THE INVENTION

IC manufacturing typically involves the sequential formation of multiple layers to form a single integrated device. The materials for each layer are chosen either because their properties allow them to inherently meet the required performance criteria for the IC device, or because their properties can be altered through the manufacturing process so that they meet those criteria. One type of material used to form a layer within an IC device is a dielectric.

Dielectric materials are electrical insulators, used to substantially electrically isolate conductive layers or features within the IC. The ratio of the amount of electrostatic energy that can be stored by a capacitor using a given dielectric material, as compared to the same capacitor with a vacuum as its dielectric, is defined as its 'relative dielectric constant' and is expressed as that material's 'k' value. Low-k dielectric materials may be viewed as those with a dielectric constant ('k' value) below that of silicon dioxide; (for $SiO_2$, k≈4.0-4.2).

As transistor gate widths have shrunken with each subsequent generation of IC development, reducing interconnect delay has now become as important as reducing transistor switching frequency for boosting IC operating speeds. Two of the primary contributors to interconnect delay are the resistance of the metal (traditionally aluminum) used for the circuit lines, and the capacitance of the dielectric (traditionally silicon dioxide; $SiO_2$) used for the interlayer dielectric (ILD).

To improve speed within the circuit lines, copper, which has approximately 30% lower electrical resistance than aluminum, has replaced aluminum in many high performance IC devices. However, copper has the lowest resistivity of metals that can easily be incorporated into IC devices, making reduction of ILD dielectric constant critical for realizing further decreases in interconnect delay times.

Several approaches have been identified for producing low-k ILD materials. Two methods which have been used or are being actively researched involve introducing carbon into the $SiO_2$ matrix (to make a carbon-doped silicon oxide, referred to as CDO, OSG, SiOCH or SiCOH), and making the ILD porous. These techniques lower the k-value; however, they also reduce the density and mechanical strength of the ILD material. As a result, these materials are easily damaged by stresses imparted to the ILD during subsequent IC device fabrication processing. Damage could include cracking through the ILD, or delamination, where the ILD layer separates from one or more adjacent layers in the IC device. Damage may arise from thermomechanical stress imparted to the ILD when the IC device is subjected to thermal cycling during manufacturing process and normal use, due to differing coefficients of thermal expansion (CTE) among the ILD and adjacent layers. The fragility of low-k ILD materials is an impediment to their inclusion in high-volume IC fabrication.

DETAILED DESCRIPTION OF THE INVENTION

Figure 1A:
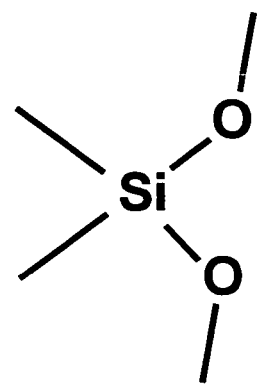
FIGS. 1a, 1b, and 1c depict the chemical structure of precursors used in forming silicon dioxide dielectric layers.
Figure 1B:
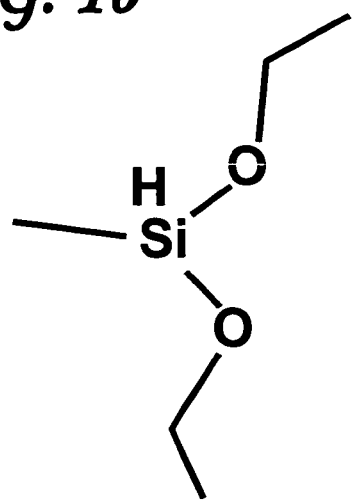
Figure 1C:
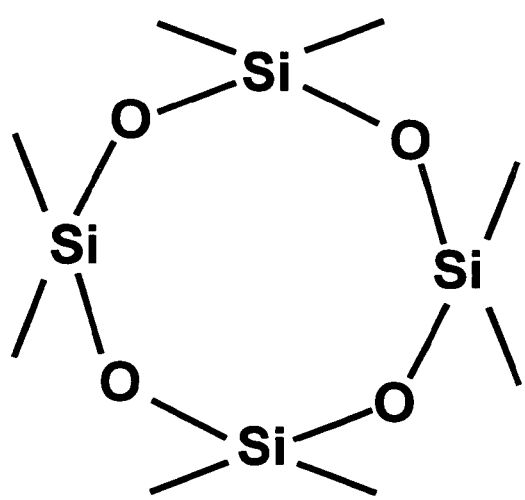

Disclosed are numerous embodiments of a thin film interlayer dielectric (ILD) material formed using a class of aluminum-bearing precursors referred to herein as 'aluminosilicate' precursors. In an embodiment, these precursors may provide a low-k dielectric material with higher mechanical strength (as characterized by elastic modulus, hardness, or cohesive strength) than is available via similar methods or materials using low-k silicon-based precursors not containing aluminum or other metal atoms (typical examples of which are shown in FIGS. 1a-1c). The increase in mechanical strength of the dielectric material formed in this embodiment may help to reduce the incidence of damage (e.g. cracking) incurred due to physically or thermally induced stresses to the integrated circuit device. These stresses are inherent to the manufacturing process and end use of IC devices in which the dielectric material is used.

Precursors generally are substances that precede some transitional or final material. In integrated circuit manufacturing, one use of precursors involves substances that may be introduced into a deposition process, and that may chemically or structurally contribute to the formation of a material. The characteristics of the precursor may substantially determine the properties of the subsequently formed material.

The precursors described in an embodiment of this invention generally present few or no significant safety risks through handling and storage, although there may be some embodiments in which additional care may be indicated. Additionally, several embodiments of the invention are liquid at room temperature, and boil at a temperature that makes them suitable for use in some deposition processes under normal operating conditions and configurations, as will be discussed hereafter.

Figure 2A:
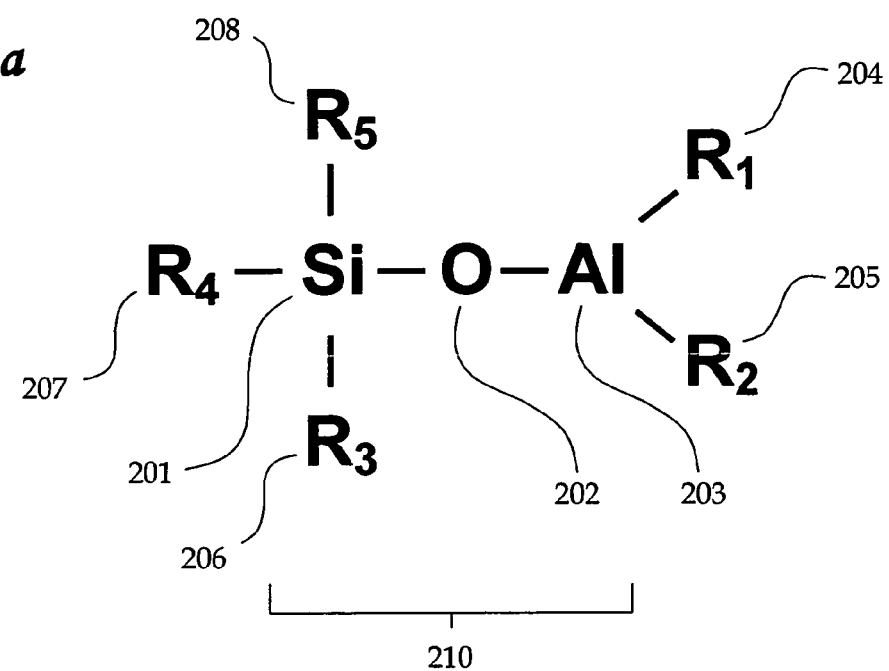
FIG. 2a depicts the general chemical structure of an aluminosilicate precursor according to an embodiment of the invention.

An embodiment of the invention includes a low-k dielectric material formed using aluminosilicate precursors. Aluminosilicate precursors have a general structure as shown in FIG. 2a. They include a silicon atom, 201, bonded to an oxygen atom, 202, that is in turn bonded with an aluminum atom, 203.

The silicon atom, 201, possesses three additional bonding sites, designated $R_3$, 206, $R_4$, 207, and $R_5$, 208. The aluminum atom possesses two additional bonding sites, designated $R_1$, 204, and $R_2$, 205. This silicon-oxygen-aluminum structure, 210, is referred to herein as a "siloxyaluminum group", or simply "siloxyaluminum". Bonding sites $R_1$-$R_5$, 204-208, are referred to as "functional group bonding sites". In some embodiments of this invention, the functional group bonding sites are occupied by organic (carbon-containing) functional groups. There are numerous varieties of precursors with this siloxyaluminum base structure due to the tremendous variations of functional groups that can be included. Variations will be described with respect to an embodiment of the present invention.

During formation of an ILD using aluminosilicate precursors in an embodiment of this invention, the bonds are broken between one or more of the functional groups and the siloxyaluminum group. The siloxyaluminum group is then incorporated into the overall silicon dioxide matrix of the ILD with a reduced number of functional groups remaining attached.

Figure 2B:
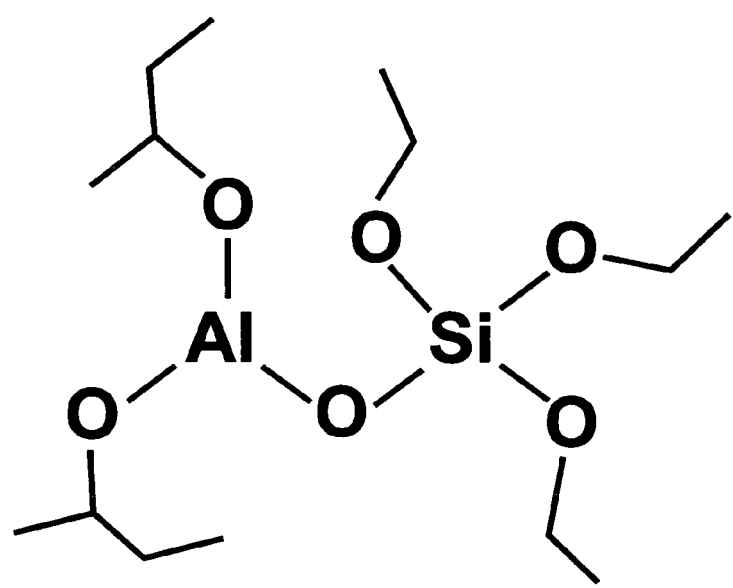
FIGS. 2b and 2c substantially depict the chemical structure of aluminosilicate precursors according to embodiments of the invention.

In an embodiment of the invention, at least one, and perhaps all of the functional group bonding sites, 204-208, of the precursor material may be occupied by alkoxy groups. In this embodiment of the invention, the functional group bonding sites are highly susceptible to reacting during the deposition process and subsequent annealing processes, providing a relatively dense matrix comprising siloxyaluminum groups in the formed material. Examples of an alkoxy group include, but are not limited to, methoxy, ethoxy, propoxy, butoxy, and others. Alkoxy groups in this embodiment could include straight-chain configurations (e.g., n-butoxy) or branched configurations (e.g., sec-butoxy). FIG. 2b discloses an aluminosilicate precursor, di-sec-butoxyaluminoxytriethoxysilane, comprising alkoxy groups according to an embodiment of this invention.

Figure 2C:
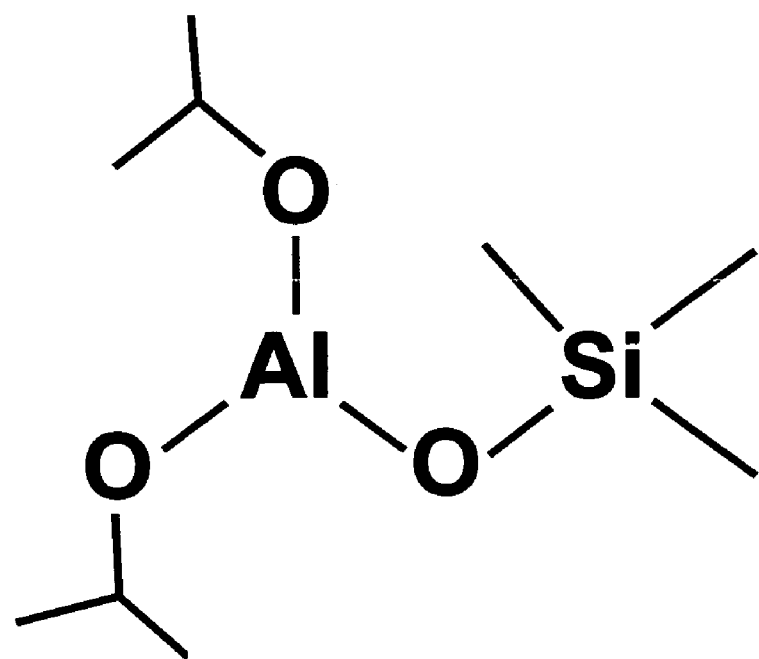

In another embodiment of the invention, at least one of the function group bonding sites is occupied by an alkyl group. Alkyl groups in this embodiment include straight-chain groups (e.g., methyl, ethyl), branched groups (e.g., isopropyl, t-butyl), unsaturated non-cyclic groups (e.g., vinyl, allyl), or saturated or unsaturated cyclic groups (e.g., cyclohexyl, cyclopentenyl). Additionally, in an embodiment of this invention, the functional groups may include the halogenated derivatives of the aforementioned alkyl groups. FIG. 2c discloses an aluminosilicate precursor, trimethylsiloxy-aluminum-diisopropoxide, comprising both alkoxy groups and alkyl groups according to an embodiment of this invention.

In another embodiment of the invention, at least one of the functional group bonding sites is occupied by an aryl group. Aryl groups in this embodiment include but are not limited to phenyl and benzyl groups. Additionally, in an embodiment of this invention, the functional groups may include the halogenated derivatives of the aforementioned aryl groups.

In an embodiment, bonding sites $R_1$, 204, and $R_5$, 208, may be restricted to incorporate only alkoxy groups. This may help ensure that both the aluminum and silicon atoms will participate in matrix forming reactions during deposition and subsequent processing without the need to add an external oxygen source, such as oxygen or nitrous oxide. The purpose of adding an oxygen source is to supply oxygen for the oxygen bonds that bind the siloxyaluminum groups to the silicon dioxide matrix. Since oxygen is already present in the alkoxy group, an external oxygen source is unnecessary. In another embodiment of the invention, bonding site $R_2$, 205, may also be restricted to an alkoxy group to limit the reactivity of the aluminum atom, as the presence of alkyl groups bonded directly to the aluminum atom may result in a highly reactive (pyrophoric), perhaps explosive compound.

In an embodiment of the invention, at least one of the functional group bonding sites is occupied by an amine group. Amine groups in this embodiment include dimethylamine, diethylamine, and others. Amine groups can be easily oxidized to allow facile formation of an aluminosilicate matrix in the presence of an oxygen source such as nitrous oxide ($N_2O$), oxygen ($O_2$), or water ($H_2O$). Restricting bonding sites $R_1$, 204, and $R_5$, 208, to alkoxy groups or amine groups may help to limit the reactivity of the aluminum atom. Precursors with amine groups can have a different level of reactivity, so could be used under different deposition conditions than can either alkoxy- or alkyl-functionalized precursors.

In the described embodiments of the invention, even larger sized members of the alkoxy-, alkyl-, and amine classes may substitute at the functional group bonding sites; however, as would be understood by someone skilled in the art, functional group size will affect the ease and method of deposition. For introducing precursors into a deposition process, it is common that precursors be in a gaseous physical state at the operating conditions used in the deposition process. However, precursors that are liquid at deposition conditions can also be used. In this case, they may be introduced into the deposition process by direct liquid injection, either of the neat (undiluted) precursor or of a solution of the precursor dissolved into a carrier solvent. Likewise, solid precursors can be first dissolved into a carrier solvent, the solution containing the precursor then being directly injected into the deposition process in a similar manner as a liquid precursor. In an embodiment of the invention, injecting precursors into the deposition process may include injecting them into the deposition chamber of a deposition apparatus, within which the deposition process takes place.

Solvents that can be used for these purposes generally are non-polar, non-reactive solvents, including but not limited to hexane and toluene. These methods expand the range of precursors that can be used to those possessing larger functional groups. Additionally, depending on the size and type of the functional groups present in the precursor, differing amounts of functional groups may remain bonded to the siloxyaluminum group after ILD deposition. Therefore, some additional heating or other processing methods may be desired to reduce the amount of remaining functional groups in the final low-k ILD material.

In an embodiment of the invention, an aluminosilicate precursor is co-deposited with a low-k silicon-based precursor. Examples of low-k silicon-based precursors for co-deposition in this invention are shown in FIG. 1a-1c, and include dimethyldimethoxysilane (FIG. 1a), diethoxymethylsilane (FIG. 1b), or octamethylcyclotetrasiloxane (FIG. 1c). These low-k silicon-based precursors contribute the majority of the silicon atoms to the final matrix of the ILD, and help provide the low-k properties of the ILD material, while the aluminosilicate precursor provides increased mechanical strength with a relatively minor impact to the dielectric constant of the ILD material.

In an embodiment, a low-k ILD material with aluminum incorporated into the matrix may be formed by using a precursor in which the silicon and aluminum are bonded either directly together into a silicon-aluminum structure, or are bonded together by something other than a single oxygen atom. Some examples of a structure so described include Si—Al, Si—$(CH_2)_n$—Al (where n=1 or more), Si—(NH)—Al, and $(Si)_2$—N—Al. The functional group bonding sites may be occupied by members of the alkoxy, alkyl, aryl, or amine groups as earlier described.

In an embodiment, an external oxygen source such as nitrous oxide ($N_2O$), oxygen ($O_2$), or water ($H_2O$) may be included in the deposition reaction. By providing an oxygen source in the deposition reaction, oxygen becomes bound to the silicon-aluminum structures. As a result, siloxyaluminum groups are formed and incorporated into the matrix of the ILD material.

In an embodiment of the invention, aluminum is incorporated into the silicon dioxide matrix of the ILD material at a concentration up to approximately 20 molar percent. At this concentration, aluminum provides increased mechanical strength to an ILD material where it is not necessary to maintain low-k properties in the ILD. In an embodiment, aluminum is incorporated into the silicon dioxide matrix of the ILD material at a concentration up to approximately 10 molar percent. This embodiment also provides a substantial increase in the mechanical strength of the ILD material, while providing a lower-k value than an embodiment having a higher aluminum content. Pure alumina, $Al_2O_3$, has a bulk dielectric constant of k≈9.7. Therefore, limiting the aluminum content in the ILD layer will minimize the increase in k value due to aluminum addition.

In an embodiment of the invention, aluminum is incorporated into the silicon dioxide matrix of the ILD material in the range of approximately 2-5 molar percent, at which increased mechanical strength is recognized while low-k dielectric properties are also achieved in the deposited ILD material. In an embodiment of the invention, addition of 3-4 molar percent aluminum relative to silicon in the matrix may increase the hardness of the ILD material by up to approximately 100%, while the k value only increases by approximately 5%.

Figure 4:
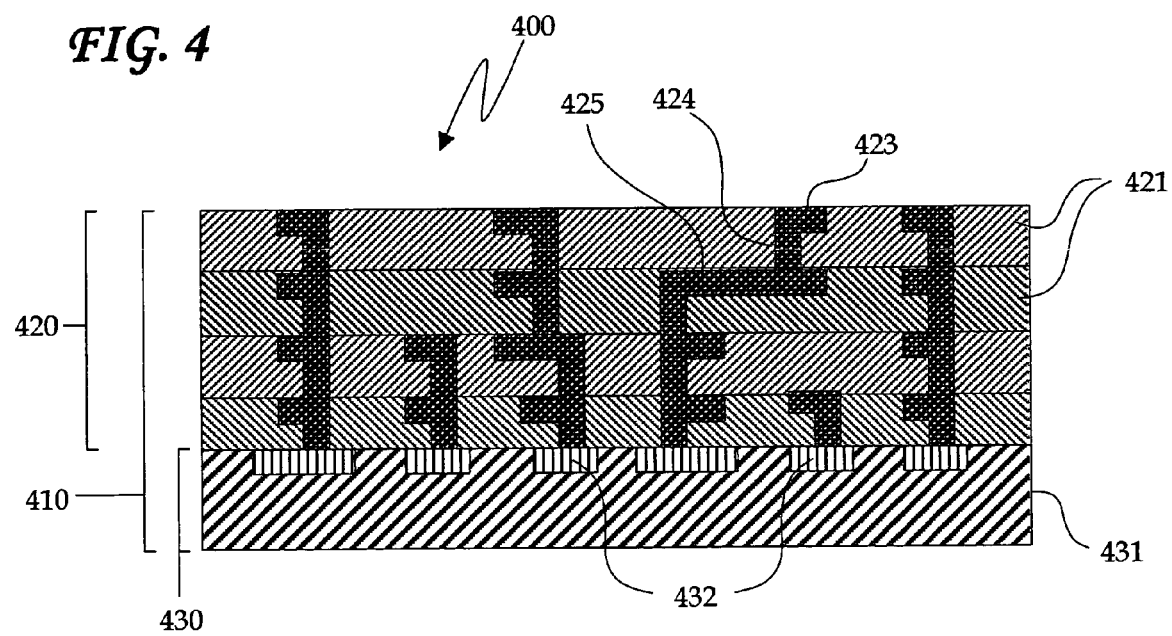
FIG. 4 is a schematic diagram illustrating a cross-sectional view of the interconnect structures and dielectric layers of an integrated circuit device according to an embodiment of the invention.

FIG. 4 illustrates one embodiment of an integrated circuit device, 400, including one or more layers, 421, of an ILD material formed by depositing aluminosilicate precursors. These layers may be provided to serve a performance requirement, such as electrical isolation of conductive pads, 423, vias, 424, traces, 425, or conductive layers of the integrated circuit from one another. This is useful to the proper and optimal performance of the finished device in normal use. The integrated circuit device, 410, includes a substrate, 431, (for example, a silicon wafer), with functional elements, 432, of the device formed on its surface. Sequentially, layers of a conductive and non-conductive stack, 420, may be formed including conductive elements, 423-425, as well as the non-conductive layers of ILD materials, 421. The layers of ILD materials, 421, may receive treatment to make them porous, to help reduce their k-value. This treatment may include exposure to heat, electron beam, or ultraviolet energies.

The materials used in the silicon wafer portion of the device, 430, and throughout the conductive and non-conductive stack, 420, may have different coefficients of thermal expansion. As a result, when the materials expand non-uniformly in response to temperature changes in the IC device, the resulting stress can cause layers to delaminate from each other, or to crack and fracture within a layer. The low-k dielectric layer 422 is particularly at risk due to the low strength of its porous structure. As mentioned, inclusion of aluminum into the silicon dioxide matrix of the low-k dielectric layer in an embodiment of the invention may add mechanical strength to the matrix to help prevent or reduce the incidence of cracking.

Figure 3:
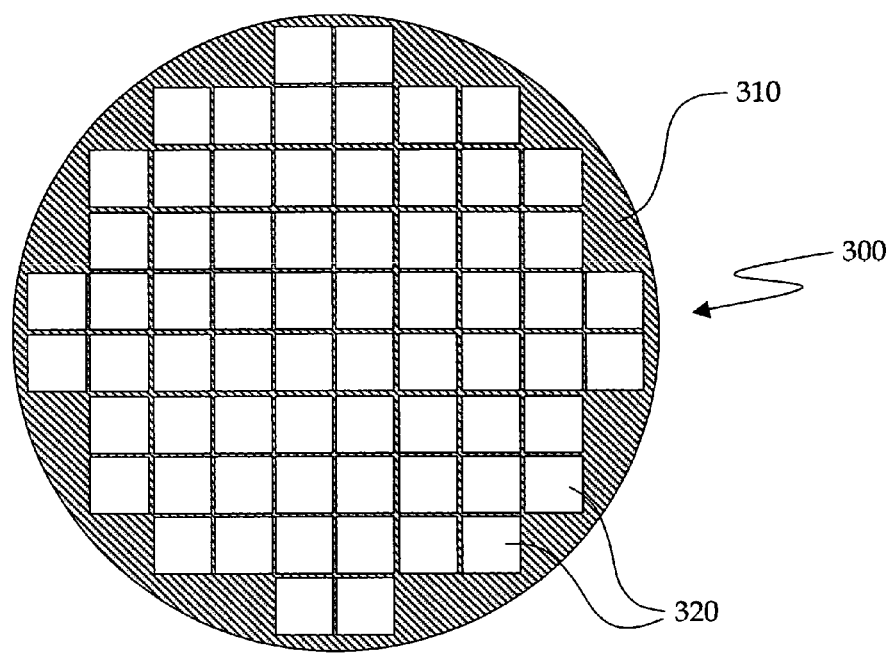
FIG. 3 depicts an embodiment of an integrated circuit substrate comprising a silicon wafer with numerous integrated circuit devices being formed thereupon, and including low-k dielectric layers according to an embodiment of the invention.

An embodiment of this invention includes a method for disposing a low-k ILD material with an aluminosilicate precursor onto an integrated circuit substrate during the formation of an integrated circuit device. For example, in an embodiment of the invention as shown in FIG. 3, an integrated circuit substrate, 300, includes a silicon wafer, 310, onto which one or more layers of an integrated circuit device, 320, may be sequentially formed, including at least one low-k ILD layer formed with an aluminosilicate precursor. In another embodiment of the invention, an integrated circuit substrate may include a printed circuit board (sometimes called a printed wiring board). In yet another embodiment, a layer of low-k dielectric material may be formed upon a sacrificial material as part of an integrated circuit substrate, this sacrificial material then being eliminated or replaced through later processing during the formation of the completed device.

Figure 5:
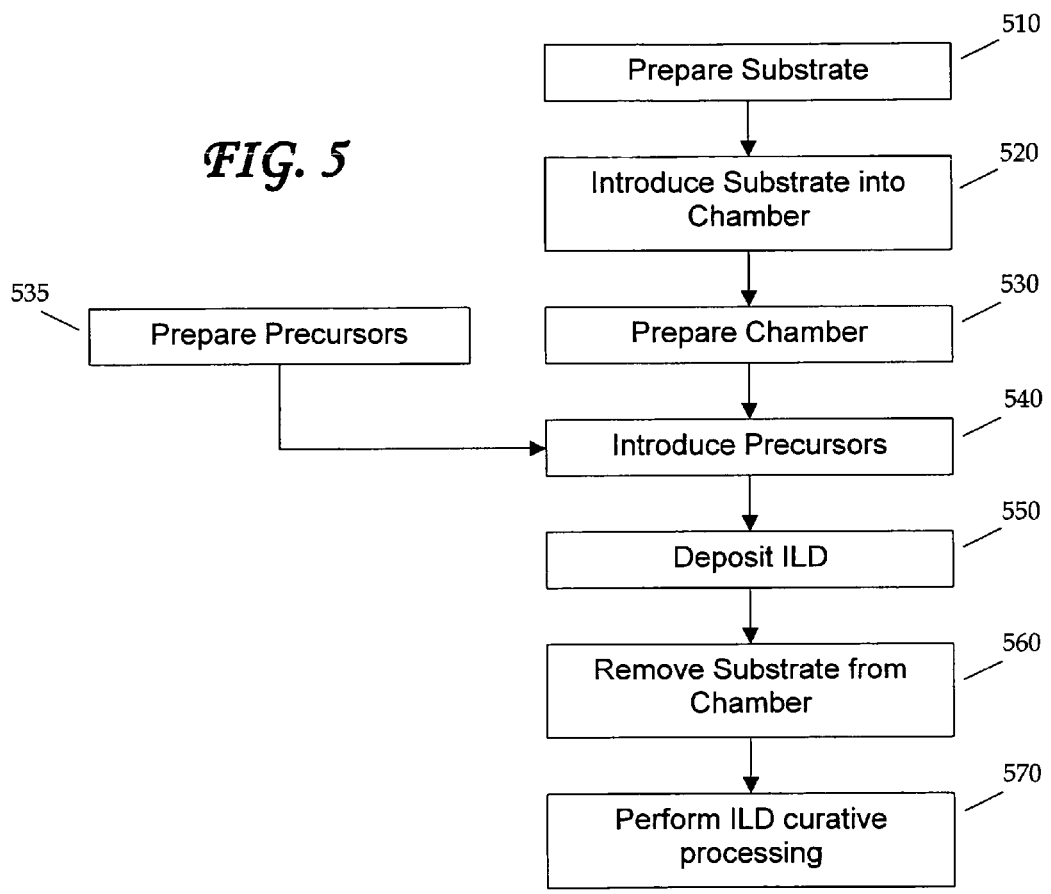
FIG. 5 is a block diagram illustrating an embodiment of a method of forming a low-k dielectric layer with aluminosilicate precursors.

As shown in FIG. 5, at 510, the substrate first receives any needed preparatory treatment such as formation of preceding layers, etching, cleaning, or other actions as are specified for a particular device being formed, a deposition apparatus, or a user's preferred practices. The substrate may then be placed into a deposition chamber, at 520, of a deposition apparatus. A deposition apparatus may be engineered for any of a number of deposition techniques, including chemical vapor deposition (CVD), plasma-enhanced chemical vapor deposition (PE-CVD), atomic layer deposition (ALD), or thermal deposition.

The precursors may require preparation prior to introduction into a deposition chamber of a deposition apparatus. In an embodiment, the precursors may be in liquid or solid form under normal deposition conditions for the deposition apparatus being used, and may require preparation, 535, as described in this specification, or as would be appreciated by someone skilled in the art.

In an embodiment, once the deposition chamber is sealed and the internal environment reaches appropriate conditions for the deposition process, 530, the precursors may be introduced into the deposition chamber, 540. In an embodiment, the introduction of the precursors may include introducing the aluminosilicate precursor and one or more low-k silicon-based precursors. Organic precursors acting as porogens may also be introduced to induce porosity in the ILD material. Examples of porogenic (porosity-inducing) organic precursors may include alpha-terpinene, beta-terpinene, D-limonene, and others as known in the art.

In an embodiment, precursors including amine groups may be used, and an oxygen source such as oxygen ($O_2$), nitrous oxide ($N_2O$), or water ($H_2O$) may be introduced into the deposition chamber at the same time as the precursors. In this case, the oxygen source may be considered a precursor, as it contributes oxygen to the structure of the deposited ILD.

In an embodiment, aluminosilicate precursors and low-k silicon-based precursors may then be co-depositied, at 550, onto the substrate. When the internal environment of the deposition chamber has reached deposition conditions, deposition will begin immediately upon introduction of precursors into a deposition chamber. The duration and other parameters of a deposition process will vary depending on the desired thickness of the deposited ILD layer and other considerations, as can be appreciated by one skilled in the art. In an embodiment, the pressure within a deposition chamber may be set between 0.1-50 torr; preferably between 1-10 torr. In an embodiment, the temperature in a deposition chamber may be set between 150-500° C.; preferably between 200-400° C. In an embodiment, the deposition time (duration) may be between 30-300 seconds. In an embodiment, when using PECVD, the RF power may be set between 250-1000 watts.

In an embodiment, after completion of a deposition process, the substrate may be removed from a deposition chamber, 560. Additional processing, 570, such as annealing or curing, may be used to remove a substantial amount of functional groups remaining within an ILD material. These processes act to cure the matrix of an ILD material by further removing functional groups that remained attached to bonding sites on siloxyaluminum groups after deposition. They also help solidify the matrix of an ILD material by increasing the number of bonds between the siloxyaluminum groups and the overall silicon dioxide matrix. In embodiments of the invention, annealing or curing treatment may include exposure to heat, electron beam, or ultraviolet energies.

Subsequently, a user may measure characteristics of an ILD material to ensure that it meets appropriate performance and dimensional requirements, as determined by a user. Additional processing may take place to produce additional layers to attain a completed IC device.

In an embodiment, rather than introducing an aluminosilicate precursor, a precursor including a silicon-aluminum structure is introduced into the chamber along with an oxygen source such as oxygen, nitrous oxide, or water, at 540. As described in this specification, the silicon-aluminum structure includes either a silicon atom bonded directly to an aluminum atom, or a silicon atom bonded to an aluminum atom by something other than a single oxygen atom. In an embodiment, during deposition, 550, the silicon and aluminum atoms become bound to an oxygen atom provided by the oxygen source, forming a siloxyaluminum group that may be incorporated into an ILD material during deposition. The remainder of the process may proceed similarly to that described for aluminosilicate precursors.

Layers formed with an aluminosilicate precursor, according to an embodiment of this invention, may also provide control during formation of various elements, features, and layers of the device, while maintaining the overall structural and low-k objectives. For example, one embodiment of the invention utilizes an ILD material as a low-k etch stop layer to prevent excessive etching of materials in an integrated circuit device.

When etching a material, an objective may be for the etching process to stop once the targeted feature dimensions are attained in the material being etched. Some etching methods are non-specific, (i.e., they will etch materials other than that intended to be affected by the etch process), therefore, one may include a material that is more resistant to the etching agent, adjacent to the targeted material. Incorporating aluminum into the silicon dioxide matrix, in an embodiment of the invention, may cause the resulting material to exhibit different etch rates than a silicon dioxide matrix not incorporating aluminum.

Figure 6:
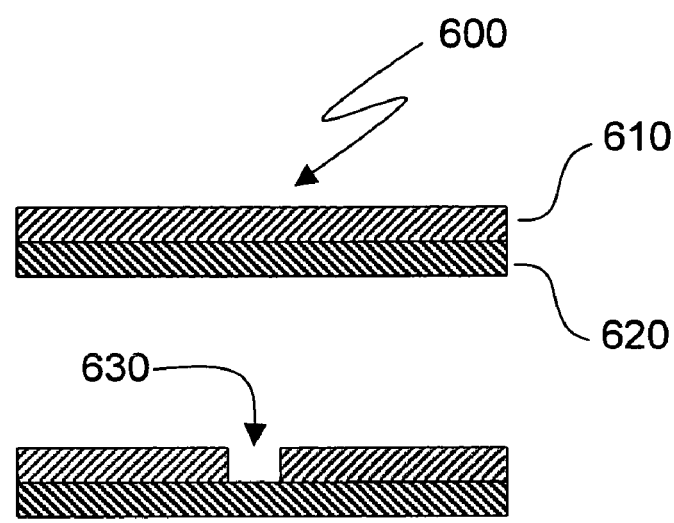
FIG. 6 depicts an etch stop material according to an embodiment of the invention.

FIG. 6 shows a structure, 600, including two materials. A first material, 620, deposited according to an embodiment of the invention, is disposed adjacent to a second material, 610, formed of an ILD material or other material not incorporating siloxyaluminum groups in its matrix, or of an ILD material incorporating a different concentration of siloxyaluminum groups. During an etching process, a material formed according to an embodiment of this invention may provide benefits as an etch stop material based on the difference in etch rates between the two materials. Once a targeted material is substantially etched and an etch stop material is exposed, 630, the etching may slow or stop in the direction where an etch stop material is disposed. In an embodiment of the invention, an etch stop material may be formed as a layer.

An embodiment of the invention may act as an etch stop layer for wet etch processes, dry etch processes, or other etch process as known in the art. It may also be desirable for an etch stop material to have low-k properties. This approach is useful in types of advanced integrated circuit devices where a low-k ILD is desirable, as features in such devices are frequently quite small, with stringent dimensional tolerances. Materials used in traditional etch stop layers may not meet the low-k requirements of advanced integrated circuit devices. Examples of traditional etch stop materials may include silicon carbide, silicon nitride, and silicon oxynitride.

The foregoing detailed description and accompanying drawings are only illustrative and not restrictive. They have been provided primarily for a clear and comprehensive understanding of the embodiments of the invention, and no unnecessary limitations are to be understood therefrom. Numerous additions, deletions, and modifications to the embodiments described herein, as well as alternative arrangements, may be devised by those skilled in the art without departing from the spirit of the embodiments and the scope of the appended claims.

What is claimed is:

1. A method, comprising:
   co-depositing precursors onto a substrate within a deposition chamber;
      at least one of the precursors comprising a porogenic organic precursor, and
      at least one of the precursors including a siloxyaluminum group,
      the siloxyaluminum group including a silicon atom and an aluminum atom bound together by an oxygen atom, and
      the silicon atom and the aluminum atom also bound to a plurality of functional groups, and
   forming a low-k dielectric layer; and
   removing said functional groups that remain attached to bonding sites on said siloxyaluminum groups after said co-deposition.

2. The method of claim 1, wherein the plurality of functional groups comprise at least one alkoxy group.

3. The method of claim 2, wherein the at least one alkoxy group comprises at least one straight-chain alkoxy group or at least one branched alkoxy group.

4. The method of claim 1, wherein the plurality of functional groups comprise at least one alkoxy group bonded with the aluminum atom, at least one alkoxy group bonded with the silicon atom, and at least one alkyl group.

5. The method of claim 4, wherein the at least one alkyl group comprises a straight-chain alkyl group or at least one of its halogenated derivatives, a branched alkyl group or at least one of its halogenated derivatives, an unsaturated non-cyclic alkyl group or at least one of its halogenated derivatives, an unsaturated cyclic alkyl group or at least one of its halogenated derivatives, or a saturated cyclic alkyl group or at least one of its halogenated derivatives.

6. The method of claim 1, wherein the functional groups comprise at least one alkoxy group bonded with the aluminum atom, at least one alkoxy group bonded with the silicon atom, and at least one amine group.

7. The method of claim 6, wherein the precursors further include at least one of oxygen, nitrous oxide, or water, as an oxygen source.

8. The method of claim 1, wherein the plurality of functional groups comprise at least one alkoxy group bonded with the aluminum, atom, at least one alkoxy group bonded with the silicon atom, and at least one aryl group.

9. The method of claim 1, wherein depositing comprises chemical vapor depositing, plasma-enhanced chemical vapor depositing, atomic layer depositing, or thermal depositing.

10. The method of claim 1, wherein the precursors include at least one of dimethyldimethoxysilane, diethoxymethylsilane, or octamethylcyclotetrasiloxane.

11. The method of claim 1, wherein depositing precursors onto a substrate includes forming a material containing approximately two to five (2-5) molar percent of siloxyaluminum.

12. The method of claim 1, wherein the substrate comprises an integrated circuit substrate.

13. The method of claim 1, further comprising exposing the precursors deposited on the substrate to at least one of heat, electron beam, or ultraviolet energies.

* * * * *